(12) United States Patent
Shin

(10) Patent No.: US 7,419,870 B2
(45) Date of Patent: Sep. 2, 2008

(54) METHOD OF MANUFACTURING A FLASH MEMORY DEVICE

(75) Inventor: Seung Woo Shin, Kyeongki-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/120,241

(22) Filed: May 2, 2005

(65) Prior Publication Data

US 2006/0046386 A1 Mar. 2, 2006

(30) Foreign Application Priority Data

Aug. 26, 2004 (KR) .................... 10-2004-0067538

(51) Int. Cl.
*H01L 21/00* (2006.01)
*H01L 21/44* (2006.01)

(52) U.S. Cl. .................. 438/239; 438/253; 438/260; 438/304; 438/396; 438/596; 257/E21.209; 257/E21.682; 257/E27.103; 257/E29.129

(58) Field of Classification Search ................ 438/257, 438/640, 301, 238, 239, 253, 304, 396, 596; 257/E21.218, E21.553, E21.682, 209, E23.602, 257/E23.134, E27.103, E29.129
See application file for complete search history.

(56) References Cited

U.S. PATENT DOCUMENTS

| | | | | |
|---|---|---|---|---|
| 5,598,019 A | * | 1/1997 | Komori et al. .............. 257/397 |
| 6,040,217 A | * | 3/2000 | Lin et al. .................... 438/258 |
| 6,355,522 B1 | * | 3/2002 | Chang et al. ................ 438/257 |
| 6,486,506 B1 | * | 11/2002 | Park et al. ................... 257/314 |
| 6,509,601 B1 | * | 1/2003 | Lee et al. .................... 257/310 |
| 6,605,506 B2 | * | 8/2003 | Wu .............................. 438/257 |
| 6,620,687 B2 | * | 9/2003 | Tseng ......................... 438/260 |
| 6,790,729 B1 | * | 9/2004 | Woo ........................... 438/257 |
| 2002/0102790 A1 | * | 8/2002 | Kim ............................ 438/239 |
| 2003/0198106 A1 | * | 10/2003 | Choi ........................... 365/200 |
| 2004/0094793 A1 | * | 5/2004 | Noguchi et al. ............. 257/315 |
| 2005/0282337 A1 | * | 12/2005 | Shyu et al. .................. 438/257 |
| 2006/0258089 A1 | * | 11/2006 | Chung-Zen ................. 438/257 |

FOREIGN PATENT DOCUMENTS

KR 2003-6893 1/2003

OTHER PUBLICATIONS

Official action issued in corresponding Korean application No. 2004-67538 dated Aug. 26, 2004.

* cited by examiner

*Primary Examiner*—Michael S Lebentritt
(74) *Attorney, Agent, or Firm*—Marshall, Gerstein & Borun LLP

(57) ABSTRACT

Provided is a method of manufacturing a flash memory device. In the method, after forming a cell string and source/drain selection transistors, it forms a first oxide film in which a sidewall oxide film and a buffering oxide film are stacked, a nitride film, and a second oxide film for spacer on the overall structure. Then, source/drain contact holes are formed. Thus, the source/drain selection transistors are prevented from being exposed while etching the source/drain contact holes, which enhances the reliability of the flash memory device.

19 Claims, 4 Drawing Sheets

METHOD OF MANUFACTURING A FLASH MEMORY DEVICE

BACKGROUND

1. Field of the Invention

The present invention relates to a method of manufacturing a flash memory device and specifically, to a method of manufacturing a flash memory device, which improves the reliability of the flash memory device by preventing source/drain selection transistors from being exposed while forming source/drain contacts.

2. Discussion of Related Art

In a NAND-type flash memory device, pluralities of transistors are arranged between drain contacts, those of which functions as drain selection transistors, and pluralities of transistors are arranged between source contacts, those of which functions as source selection transistors. And, pluralities of memory cells, e.g., 16, 32, or 64 memory cells are serially connected between the drain selection transistor and the source selection transistor, the construction of which forms a cell string. Here, while distances between memory cells of the cell string are same to each other, a distance between a memory cell and an adjacent drain or source selection transistor is designed to be wider than the distance between the memory cells on basis of the characteristics of the transistors.

FIGS. 1A through 1D are sectional diagrams illustrating sequential processing steps by a conventional method of manufacturing a flash memory device.

Referring to FIG. 1A, source/drain selection transistors 12 and a cell string 11 having plural memory cells are formed in a predetermined region over a semiconductor substrate 101. Here, a single memory cell is constructed of a tunnel oxide film 102, a floating gate 103, a dielectric film 104, and a control gate 105, those being stacked over the semiconductor substrate 101. Meantime, each of the source/drain selection transistors 12 is constructed of a gate oxide film 106 and a gate 107 that are stacked therein.

Referring to FIG. 1B, after depositing an oxide film 108 on the overall structure by means of a chemical vapor deposition (CVD) process, spacers are formed on sidewalls of the source/drain selection transistors 12 by conducting an etch-back process for the entire surface of the overall structure. The etching process for forming the spacers is carried out to completely disclose the semiconductor substrate 101 between the source/drain selection transistors 12. And then, a nitride film 109 is deposited on the overall structure, which is directed to prevent side damages on the source/drain selection transistors 12 during an etching process for forming source/drain contacts.

Referring to FIG. 1C, after forming an interlevel insulation film 110 on the overall structure, source/drain contacts 111 are formed by way of a lithography and etching process using a source/drain contact mask. However, if the etching process is conducted to completely disclose the semiconductor substrate 101 between the source/drain selection transistors 12, the nitride film 109 on the sidewalls of the source/drain selection transistors 12 is damaged to disclose the spacers, which causes the source/drain selection transistors 12 to be disclosed during the subsequent wet etching process.

Referring to FIG. 1D, a metal layer is deposited to fill up the source/drain contacts 111, forming plugs 112. Thus, the source/drain selection transistors 12 preliminarily disclosed are shorted to the plugs 112, which degrades the reliability of the flash memory device.

SUMMARY OF THE INVENTION

An object of the present invention is to provide a method of manufacturing a flash memory device, capable of improving the reliability of the device by preventing source/drain selection transistors from being exposed while forming source/drain contacts and then preventing a short circuit while forming plugs subsequent thereto.

Another object of the present invention is to provide a method of manufacturing a flash memory device, capable of enhancing the reliability of the flash memory device by preventing source/drain selection transistors from being disclosed while etching source/drain contacts, for which the source/drain contacts are formed after forming a cell string, the source/drain selection transistors, a first oxide film in which a sidewall oxide film and a buffering oxide film are stacked, a nitride film, and a second oxide film for spacer on the overall structure.

A method of manufacturing a flash memory device, according to the present invention, comprising the steps of forming pluralities of memory cells and selection transistors in a on a semiconductor substrate, sequentially forming a first oxide film, a nitride film, and a second oxide film on the resulting structure after forming the memory cells and selection transistors, forming spacers on sidewalls of the selection transistors by etching the second oxide film, forming an interlevel insulation film on the resulting structure after forming the spacers and forming contact holes between the selection transistors by partially etching the interlevel insulation film, and filling the contact holes to form plugs.

Preferably, the first oxide film is formed of a sidewall oxide film and a buffering oxide film that are stacked.

Preferably, the sidewall oxide film is formed by an oxidation process.

Preferably, the buffering oxide film is formed by a CVD process.

Preferably, the buffering oxide film is formed of HTO (DCS+$N_2O$) using DCS, HTO ($SiH_4$+$N_2O$) using $SiH_4$, or LPTEOS.

Preferably, the nitride film is formed thicker than 50 Å by means of an LPCVD process.

Preferably, the second oxide film is formed in thickness to completely fill up spaces between the memory cells.

Preferably, the second oxide film is formed of HTO (DCS+$N_2O$) using DCS, HTO ($SiH_4$+$N_2O$) using $SiH_4$, or LPTEOS.

Preferably, the interlevel insulation film is formed of a BPSG or HDP oxide film.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1A:
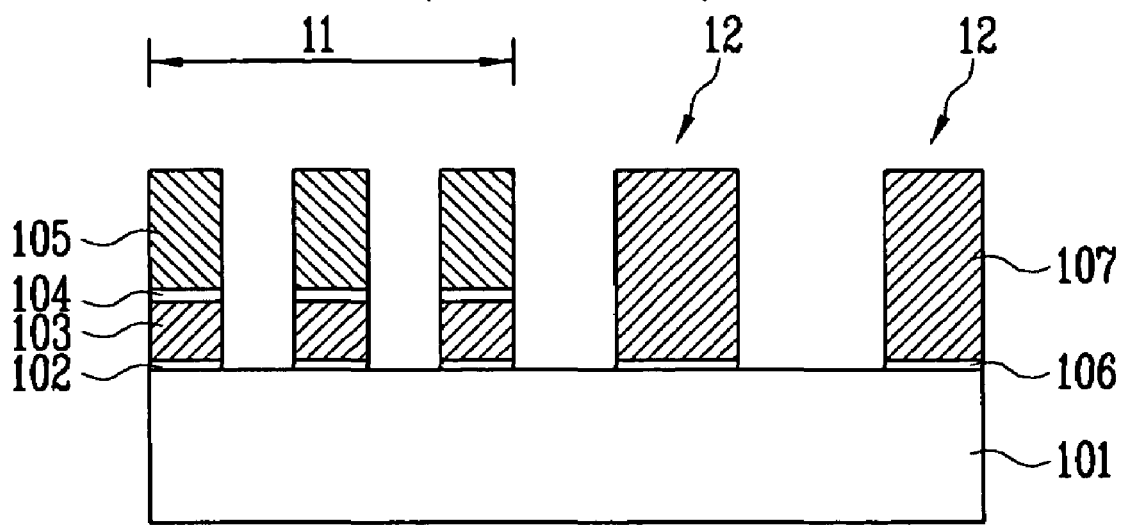
FIGS. 1A through 1D are sectional diagrams illustrating sequential processing steps by a conventional method of manufacturing a flash memory device.
Figure 1B:
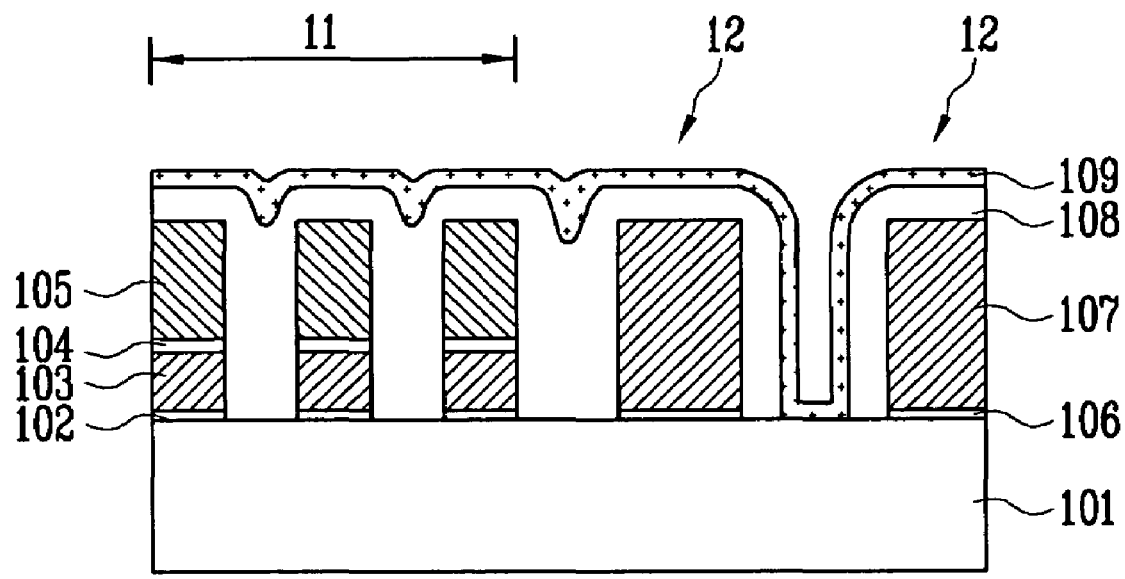
Figure 1C:
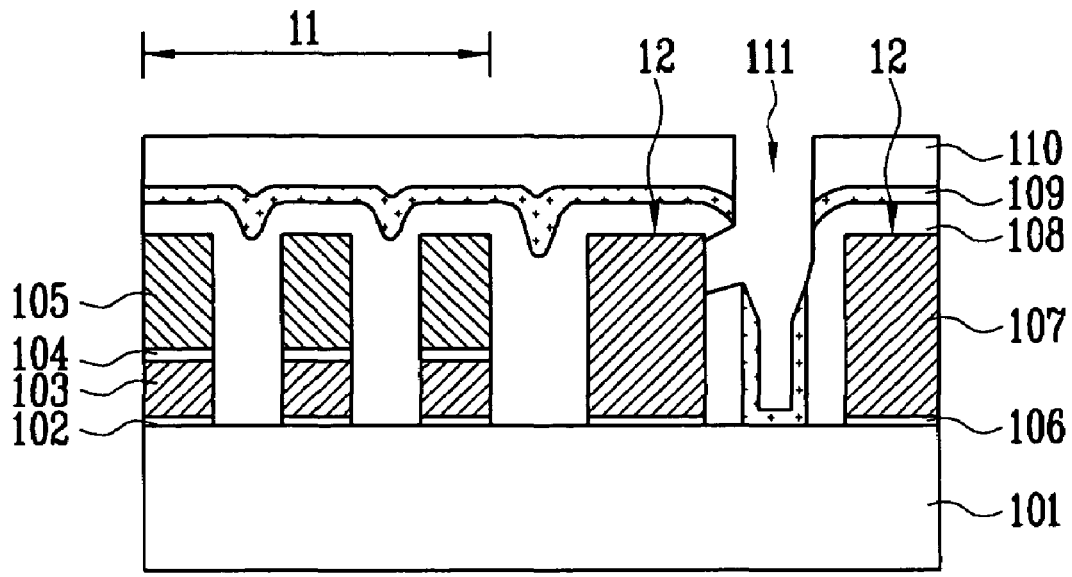
Figure 1D:
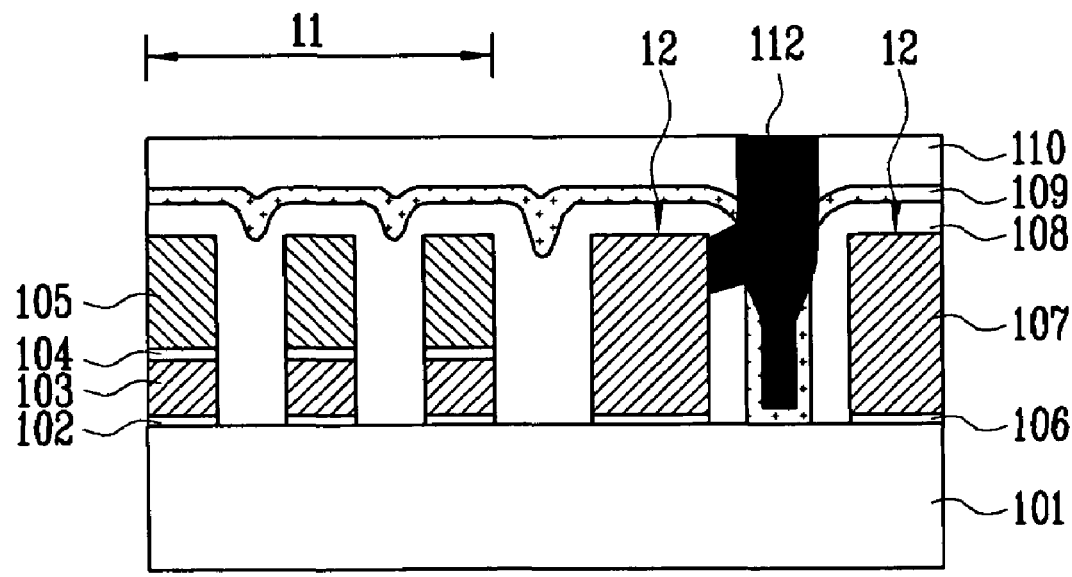

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout the specification.

It will also be understood that when a layer is referred to as being "on" another layer or substrate, it can be directly on the other layer or substrate, or intervening layers may also be present.

FIGS. 2A through 2D are sectional diagrams illustrating sequential processing steps by a method of manufacturing a NAND-type flash memory device in accordance with the present invention.

Figure 2A:
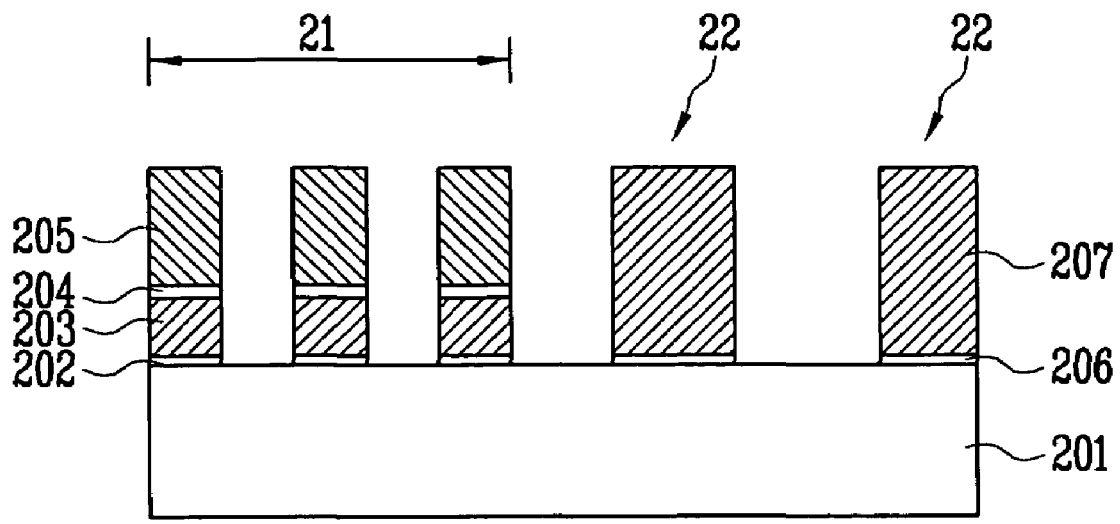
FIGS. 2A through 2D are sectional diagrams illustrating sequential processing steps by a method of manufacturing a flash memory device in accordance with the present invention.

Referring to FIG. 2A, source/drain selection transistors 22 and a cell string 21 having plural memory cells are formed in a predetermined region over a semiconductor substrate 201. Here, each of the memory cells constituting the cell string 21 is constructed of a tunnel oxide film 202, a floating gate 203, a dielectric film 204, and a control gate 205, those being stacked over the semiconductor substrate 201. Meantime, each of the source/drain selection transistors 22 is constructed of a gate oxide film 206 and a gate 207 that are stacked therein. Here, while distances between the memory cells of the cell string 21 are same to each other, a distance between a memory cell and an adjacent one of the source/drain selection transistors 22 is designed to be wider than the distance between the memory cells on basis of the characteristics of the transistors.

Figure 2B:
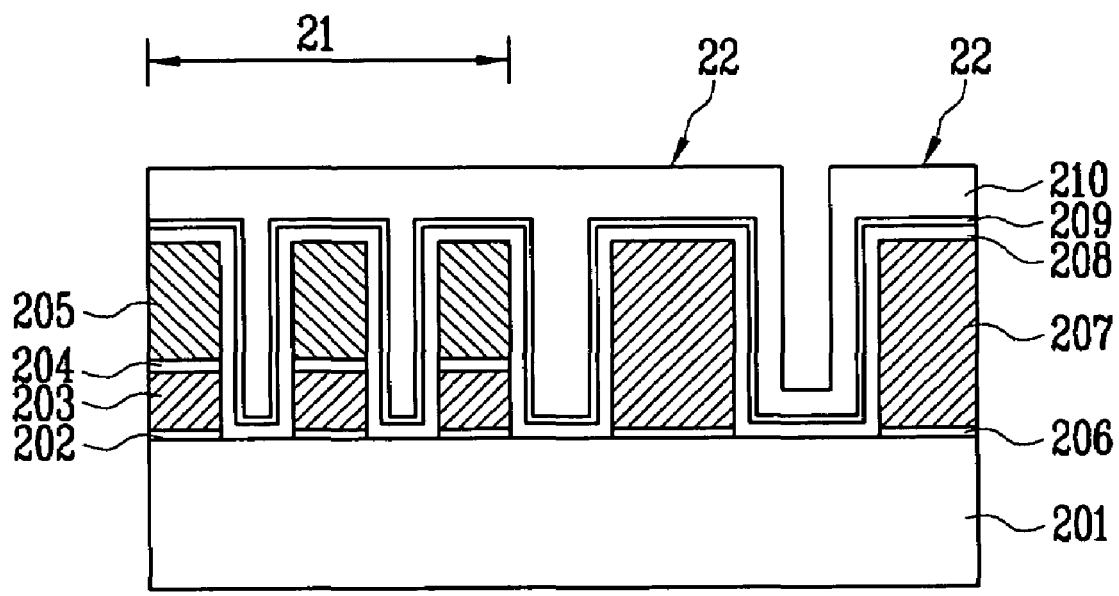

Referring to FIG. 2B, a first oxide film 208 is deposited on the overall structure. The first oxide film 208 is formed of a sidewall oxide film and a buffering oxide film that are stacked therein. Here, the sidewall oxide film is formed by an oxidation process that is regulated proper to the characteristic of the device. And, the buffering oxide film is formed by means of a CVD process, which is preferred to be in the thickness about 50 Å with being required to be thin as possible in order to maximize an interval margin when source/drain contacts are completed. Meanwhile, the buffering oxide film is formed of HTO (DCS+$N_2$O) using DCS, HTO ($SiH_4$+$N_2$O) using $SiH_4$, or LPTEOS.

Next, a nitride film 209 is deposited on the first oxide film 208. The nitride film 209 is provided for an important function to prevent an etchant from permeating into the buffering oxide film along a sidewall direction during a wet etching process to remove an oxide film remaining in the bottom of source/drain contacts after conducting an etching process to form the source/drain contacts. Therefore, the nitride film needs to be thicker than 50 Å so as to accomplish the effect of preventing the permeation by the etchant for the oxide film, preferably being formed by an LPCVD process. But, if the nitride 209 is too thick, the capacitance between the cell strings 21 greatly increases to cause a crosstalk effect between lines, resulting in degradation of cell characteristic, e.g., deterioration of data retention and program disturbance.

After then, a second oxide film 210 is deposited on the overall structure. The second oxide film 210 forms spacers on sidewalls of transistors in a peripheral circuit region or of the source/drain selection transistors, acting as typical gate spacers protecting ion injection into the lower of the semiconductor substrate 201 during the subsequent ion implantation process. While the thickness of the second oxide film 210 is established by the transistor characteristics such as threshold voltage and leakage current, preferably being in the thickness capable of completely filling up spaces between memory cells at least. The second oxide film 210 is formed of HTO (DCS+$N_2$O) using DCS, HTO ($SiH_4$+$N_2$O) using $SiH_4$, or LPTEOS.

Figure 2C:
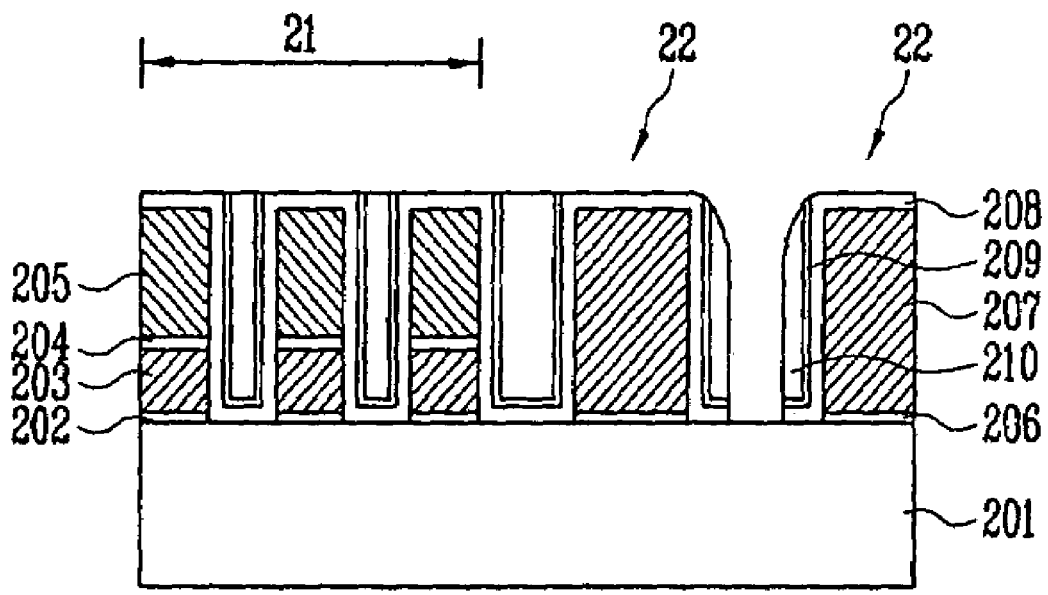

Referring to FIG. 2C, spacers are formed on sidewalls of the source/drain selection transistors 22 by entirely etching the second oxide film 210.

Figure 2D:
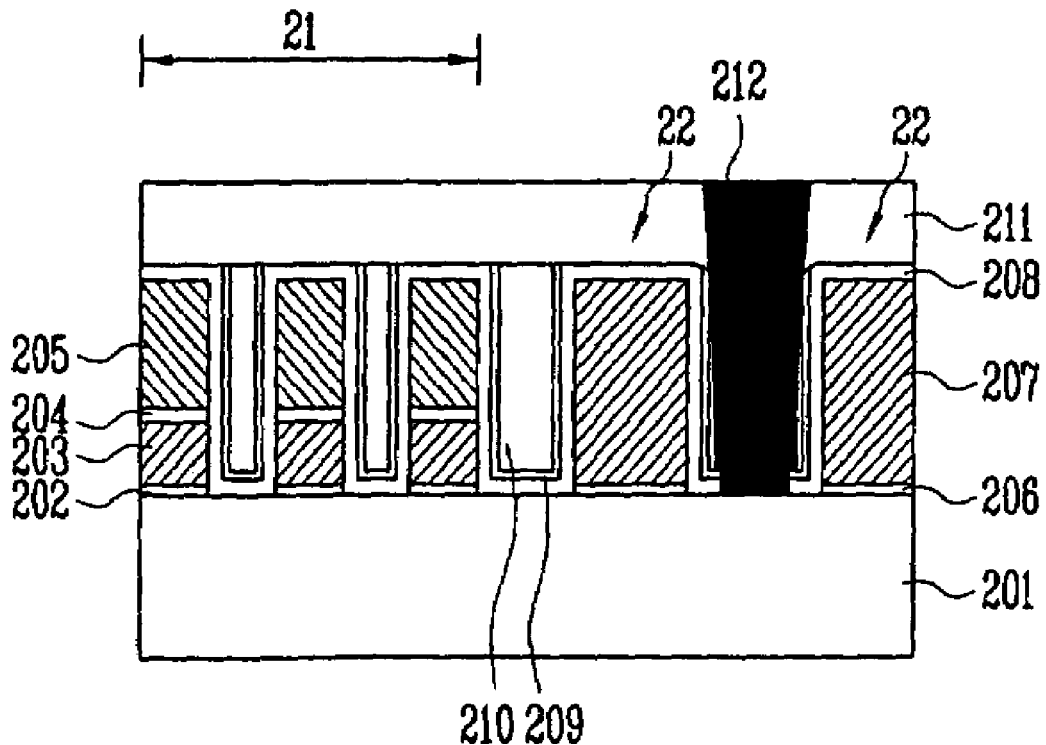

Referring to FIG. 2D, after forming an interlevel insulation film 211 on the overall structure with a BPSG film or an HDP oxide film that has a good gap-filling quality, source/drain contact holes 212 are formed by way of a lithography and etching process using a source/drain contact mask. Meanwhile, the etching process to form the source/drain contact holes 212 is carried out utilizing gas with good straightness, maximizing the bottom area of the contacts. After then, a conductive layer is formed to fill up the source/drain contact holes 212, completing plugs 213.

As described above, according to the present invention, it enhances the reliability of the flash memory device and assures an enough margin of overlay while forming plugs, by preventing source/drain selection transistors from being disclosed while etching source/drain contacts, for which the source/drain contacts are formed after forming a cell string, the source/drain selection transistors, a first oxide film in which a sidewall oxide film and a buffering oxide film are stacked, a nitride film, and a second oxide film for spacer on the overall structure. It also improves the characteristic of program disturbance in the device because the method of the present invention does not use an SAC nitride film to be free from stress that affects the semiconductor substrate due to a thick nitride film. Moreover, it is possible to assure a relatively wide bottom area since the etching process with good straightness is conducted to form the source/drain contacts.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of manufacturing a flash memory device, the method comprising:
   forming pluralities of memory cells and selection transistors on a semiconductor substrate;
   forming a sidewall oxide film and a buffering oxide film that are stacked on an entire surface of the semiconductor substrate including the memory cells and the selection transistors;
   forming a nitride film on the buffering oxide film;
   forming a further oxide film on the nitride film;
   forming spacers comprising the sidewall oxide film, the buffering oxide film, the nitride film, and the further oxide film wherein the nitride film is adjacent to the buffering oxide film, and the oxide film is adjacent to the nitride film on sidewalls of the selection transistors by performing an etch back process after forming the further oxide film;
   forming an interlevel insulation film on the resulting structure after forming the spacers;
   forming contact holes between the selection transistors by partially etching the interlevel insulation film; and
   filling the contact holes to form plugs.

2. The method as set forth in claim 1, wherein the sidewall oxide film is formed by an oxidation process.

3. The method as set forth in claim 1, wherein the buffering oxide film is formed by a CVD process.

4. The method as set forth in claim 1, wherein the buffering oxide film is formed of HTO (DCS+$N_2O$) using DCS, HTO ($SiH_4$+$N_2O$) using $SiH_4$, or LPTEOS.

5. The method as set forth in claim 1, wherein the nitride film is formed thicker than 50 Å by means of an LPCVD process.

6. The method as set forth in claim 1, wherein the further oxide film is formed in thickness to completely fill up spaces between the memory cells.

7. The method as set forth in claim 1, wherein the further oxide film is formed of HTO (DCS+$N_2O$) using DCS, HTO ($SiH_4$+$N_2O$) using $SiH_4$, or LPTEOS.

8. The method as set forth in claim 1, wherein the interlevel insulation film is formed of a BPSG or HDP oxide film.

9. A method of manufacturing a flash memory device, the method comprising:
   forming pluralities of memory cells and selection transistors on a semiconductor substrate;
   sequentially forming a sidewall oxide film, a buffering oxide film, a nitride film, and a further oxide film on an entire surface of the semiconductor substrate including the memory cells and the selection transistors;
   forming spacers comprising the sidewall oxide film, the buffering oxide film, the nitride film, and the further oxide film wherein the nitride film is adjacent to the buffering oxide film, and the further oxide film is adjacent to the nitride film on sidewalls of the selection transistors by performing an etch back process;
   forming an interlevel insulation film on the resulting structure after forming the spacers;
   forming contact holes between the selection transistors by partially etching the interlevel insulation film; and
   filling the contact holes to form plugs, wherein the nitride film is formed thicker than 50 Å by means of an LPCVD process.

10. The method as set forth in claim 9, wherein the sidewall oxide film is formed by an oxidation process.

11. The method as set forth in claim 9, wherein the buffering oxide film is formed by a OVO process.

12. The method as set forth in claim 9, wherein the buffering oxide film is formed of HTO (DCS+$N_2O$) using DCS, HTO ($SiH_4$+$N_2O$) using $SiH_4$, or LPTEOS.

13. The method as set forth in claim 9, wherein the further oxide film is formed in thickness to completely fill up spaces between the memory cells.

14. The method as set forth in claim 9, wherein the further oxide film is formed of HTO (DCS+$N_2O$) using DCS, HTO ($SiH_{4+N2}O$) using $SiH_4$, or LPTEOS.

15. The method as set forth in claim 9, wherein the interlevel insulation film is formed of a BPSG or HDP oxide film.

16. The method as set forth in claim 1, wherein spaces between the memory cells and between the memory cell and the selection transistor are filled with the further oxide film after performing the etch back process to form the spacers.

17. The method as set forth in claim 1, wherein a portion of the further oxide film formed on a sidewall of the selection transistor is etched and the nitride film is exposed when the contact holes are formed.

18. The method as set forth in claim 9, wherein spaces between the memory cells and between the memory cell and the selection transistor are filled with the further oxide film after performing the etch back process to form the spacers.

19. The method as set forth in claim 9, wherein a portion of the further oxide film formed on a sidewall of the selection transistor is etched and the nitride film is exposed when the contact holes are formed.

* * * * *